(12) United States Patent
Dohse

(10) Patent No.: US 8,482,732 B2
(45) Date of Patent: *Jul. 9, 2013

(54) ALIGNMENT SYSTEM FOR VARIOUS MATERIALS AND MATERIAL FLOWS

(75) Inventor: Hans Dohse, Sunnyvale, CA (US)

(73) Assignee: Maskless Lithography, Inc., San Jose, CA (US)

( * ) Notice: Subject to any disclaimer, the term of this patent is extended or adjusted under 35 U.S.C. 154(b) by 305 days.

This patent is subject to a terminal disclaimer.

(21) Appl. No.: 13/041,622

(22) Filed: Mar. 7, 2011

(65) Prior Publication Data

US 2011/0157577 A1 Jun. 30, 2011

Related U.S. Application Data

(63) Continuation-in-part of application No. 12/962,241, filed on Dec. 7, 2010, now Pat. No. 8,284,399, which is a continuation of application No. 12/240,781, filed on Sep. 29, 2008, now Pat. No. 7,847,938.

(60) Provisional application No. 60/997,280, filed on Oct. 1, 2007.

(51) Int. Cl.
*G01B 11/00* (2006.01)

(52) U.S. Cl.
USPC ............................ 356/400; 356/399; 356/401

(58) Field of Classification Search
USPC .................... 356/399–401; 250/548; 700/121
See application file for complete search history.

(56) References Cited

U.S. PATENT DOCUMENTS

| | | | |
|---|---|---|---|
| 4,261,107 A | 4/1981 | Coleman et al. | |
| 4,798,470 A | 1/1989 | Moriyama et al. | |
| 4,952,060 A | 8/1990 | Ina et al. | |
| 5,015,555 A | 5/1991 | Lazaar | |
| 5,124,927 A | 6/1992 | Hopewell et al. | |
| 5,285,397 A | 2/1994 | Heier et al. | |
| 5,407,783 A | 4/1995 | Caruso | |
| 5,754,897 A | 5/1998 | Suzuki et al. | |
| 5,808,910 A | 9/1998 | Irie et al. | |
| 5,834,785 A | 11/1998 | Coon | |
| 5,874,190 A | 2/1999 | Tanaka | |
| 6,002,487 A | 12/1999 | Shirata | |
| 6,005,978 A | 12/1999 | Garakani | |
| 6,037,791 A | 3/2000 | Yap et al. | |
| 6,424,879 B1 | 7/2002 | Chilese et al. | |

(Continued)

OTHER PUBLICATIONS

B.F. Conaghan, Ph.D., "Printed Circuits Handbook", C.F. Coombs, Jr., 5th ed., (McGravel-Hill, 2001), Chapter 26, 30 pages.

*Primary Examiner* — Tarifur Chowdhury
*Assistant Examiner* — Isiaka Akanbi
(74) *Attorney, Agent, or Firm* — Schneck & Schneck; Thomas Schneck

(57) ABSTRACT

A method and system for alignment of a tool to a workpiece in a continuous or discontinuous material flow are disclosed. The workpiece may be a portion of a web of material. An imaging system captures first and second images of the workpiece at first and second occasions respectively. Microscopic native features of the workpiece are selected, detected, tracked and/or compared in the first and second images. Based on the correspondence between, tracking or relative displacement of features as captured in the first and second images, an alignment to the workpiece is controlled. In embodiments, the workpiece and a tool, a projected image or a pattern to be imparted to the workpiece by a lithography or photolithography apparatus are aligned based upon positioning information determined from an analysis of correlated features or texture in the images. Positioning information may include a positioning error or a distortion indication.

63 Claims, 7 Drawing Sheets

U.S. PATENT DOCUMENTS

| | | |
|---|---|---|
| 6,509,201 B1 | 1/2003 | Wright |
| 6,525,805 B2 | 2/2003 | Heinle |
| 6,563,586 B1 | 5/2003 | Stanke et al. |
| 6,701,197 B2 | 3/2004 | Ben-Ezra et al. |
| 6,731,376 B1 | 5/2004 | Markle |
| 6,753,947 B2 | 6/2004 | Meisburger et al. |
| 6,819,789 B1 | 11/2004 | Kantor et al. |
| 6,861,186 B1 | 3/2005 | Pagette et al. |
| 6,875,992 B2 | 4/2005 | Castenmiller et al. |
| 6,879,378 B2 | 4/2005 | Morita et al. |
| 6,894,261 B2 | 5/2005 | Castenmiller et al. |
| 6,924,883 B2 | 8/2005 | Ozaki et al. |
| 6,936,385 B2 | 8/2005 | Lof et al. |
| 7,020,350 B2 | 3/2006 | Sakai et al. |
| 7,058,474 B2 | 6/2006 | Ganot et al. |
| 7,062,354 B2 | 6/2006 | Ganot et al. |
| 7,138,620 B2 | 11/2006 | Trisnadi et al. |
| 7,160,654 B2 | 1/2007 | Tsai |
| 7,167,296 B2 | 1/2007 | Meisburger |
| 7,295,362 B2 | 11/2007 | Meisburger |
| 7,375,793 B2 | 5/2008 | Duesman et al. |
| 7,650,839 B2 | 1/2010 | Brost et al. |
| 7,847,938 B2 | 12/2010 | Dohse |
| 2002/0055789 A1 | 5/2002 | Ben-Ezra et al. |
| 2003/0064307 A1 | 4/2003 | Nakamura et al. |
| 2003/0103277 A1 | 6/2003 | Mohwinkel |
| 2003/0190071 A1 | 10/2003 | Ganot et al. |
| 2004/0126004 A1 | 7/2004 | Kikuchi |
| 2005/0105071 A1 | 5/2005 | Ishii |
| 2005/0213064 A1 | 9/2005 | Katayama et al. |
| 2005/0213806 A1 | 9/2005 | Hanina et al. |
| 2005/0225788 A1 | 10/2005 | Katayama et al. |
| 2006/0091330 A1 | 5/2006 | Van Bilsen et al. |
| 2006/0092199 A1 | 5/2006 | White et al. |
| 2006/0170934 A1 | 8/2006 | Picciotto et al. |
| 2007/0035709 A1 | 2/2007 | Kuit et al. |
| 2007/0046940 A1 | 3/2007 | Gao et al. |
| 2007/0212856 A1 | 9/2007 | Owen |
| 2009/0086207 A1 | 4/2009 | Dohse |

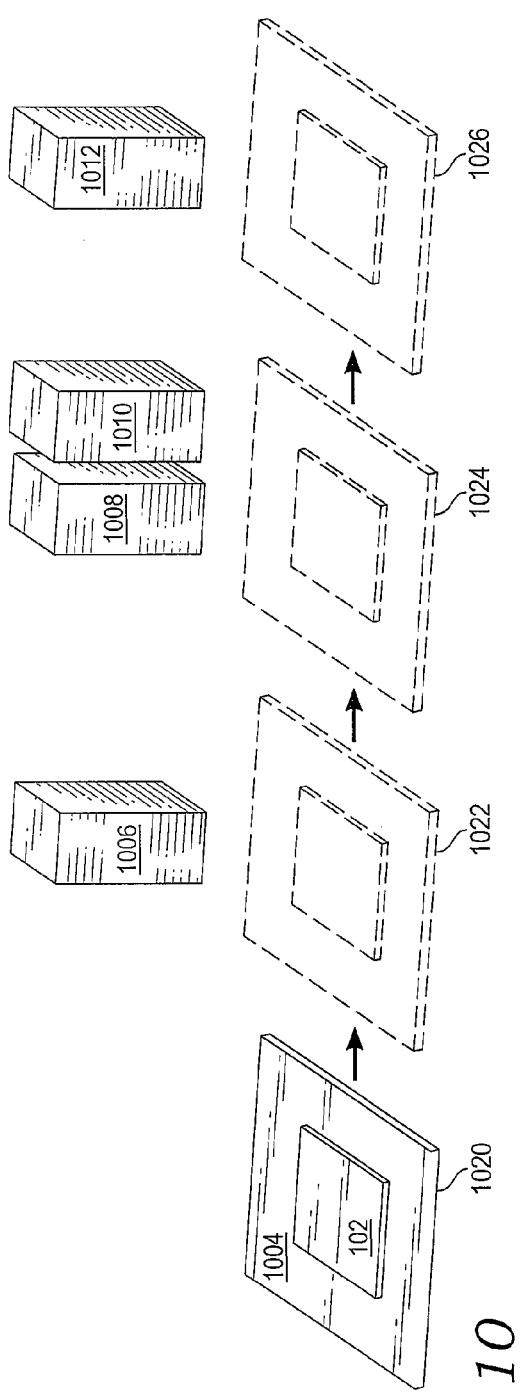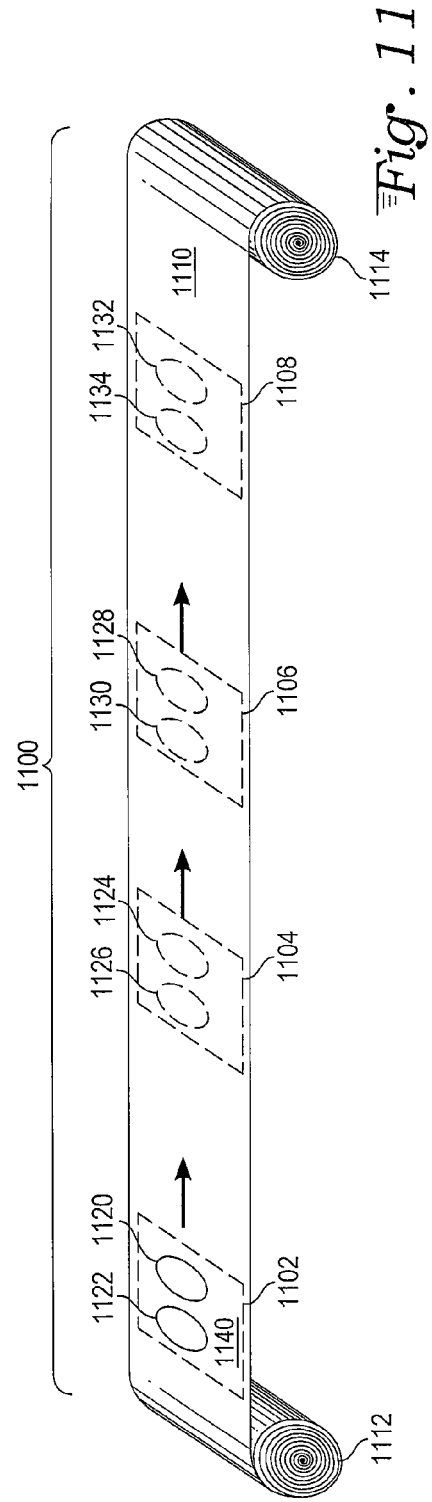

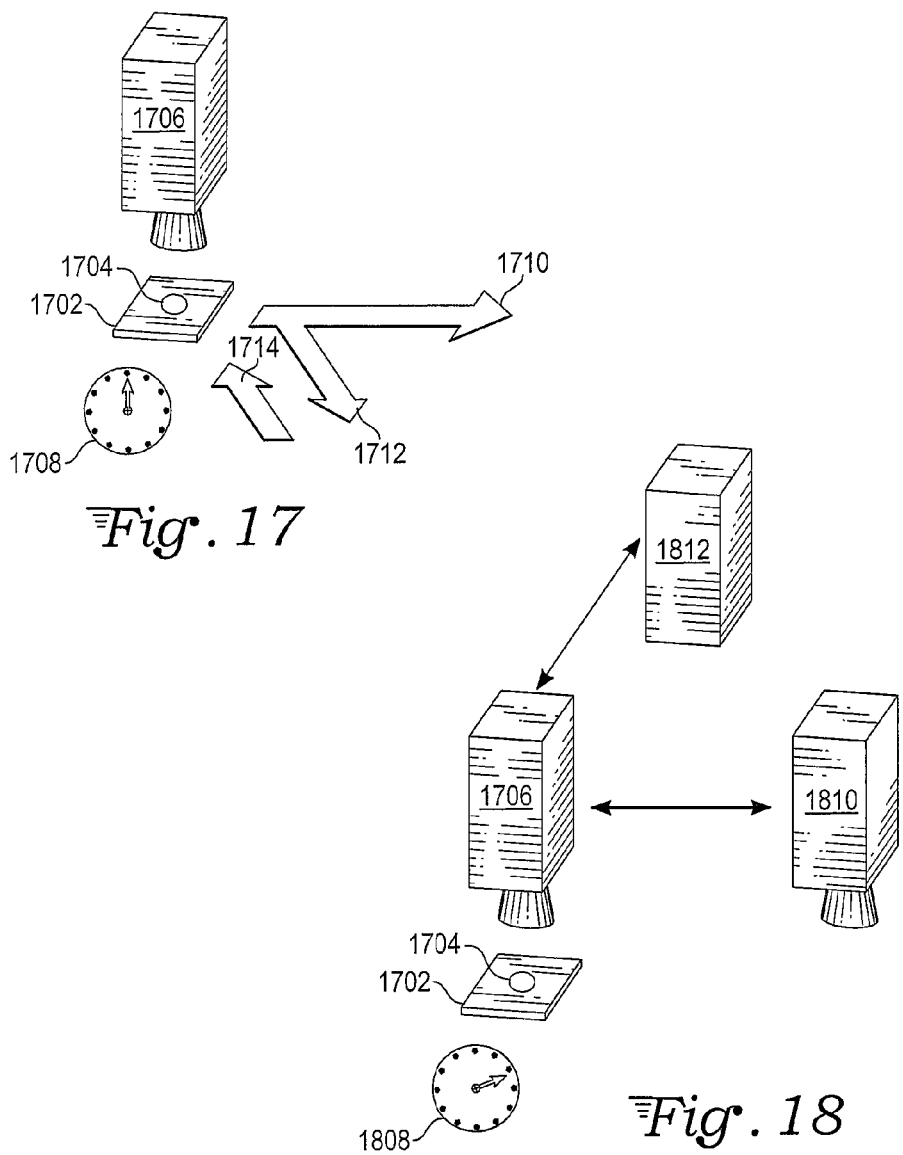
Fig. 17
Fig. 18
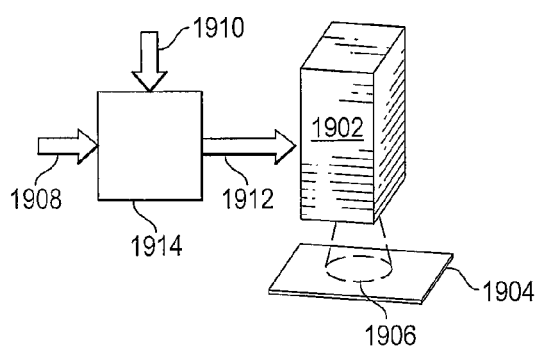
Fig. 19

ALIGNMENT SYSTEM FOR VARIOUS MATERIALS AND MATERIAL FLOWS

CROSS-REFERENCE TO RELATED APPLICATIONS

This application is a continuation-in-part of U.S. patent application Ser. No. 12/962,241 filed Dec. 7, 2010 now U.S. Pat. No. 8,284,399, which is in turn a continuation of U.S. patent application Ser. No. 12/240,781 filed Sep. 29, 2008 now U.S. Pat. No. 7,847,938, which in turn claims priority under 35 USC §119(e) from U.S. Provisional Application No. 60/997,280 filed Oct. 1, 2007.

TECHNICAL FIELD

The field of the present invention relates generally to alignment systems and more specifically to alignment in lithography and other tool-based systems.

BACKGROUND

In various systems and processes, alignment of a tool and a workpiece allows processing of the workpiece using the tool. Precision alignment of a workpiece and a tool often makes use of an alignment system. Alignment can involve moving the workpiece, the tool or both.

Examples of systems and processes in which an alignment system is applicable include lithography, photolithography, laser etching, printed circuit board masking, printed circuit board drilling, flexible circuit board manufacture, micro-machining, precision assembly, robotics, computer-aided manufacturing and other printing and manufacturing tasks.

Photolithography systems require precise alignment of a workpiece, such as a printed circuit board or a semiconductor wafer, and a photolithographic apparatus, such as a projection optics unit. As printed circuit board manufacture and semiconductor wafer processing can involve multiple layers, with each layer having a pattern to be imparted to a substrate, precise alignment of the respective substrate to the projection optics unit is performed prior to each patterning step in which an exposure image is projected on the substrate. Failure to adequately align the substrate and the pattern results in a misaligned pattern on the substrate, often resulting in rework, rejected parts or field failures due to low reliability.

Precision alignment in known photolithography systems makes use of a target alignment pattern, sometimes referred to as an alignment reticle, deposited on a substrate in a masking step. Subsequent masking steps, in which subsequent patterned layers are applied in additive processes or etched to remove in subtractive processes, or combinations thereof, rely on aligning to a previously deposited target alignment pattern, and may add further alignment patterns. Quality-control checking often includes a visual or automated inspection of the relative alignment of such deposited target patterns from multiple layers.

In certain processes it is desirable to operate on a material that is a continuous web, as may be routed over rollers. Examples of such processes include printing of newspapers, magazines, books, packaging and other articles on paper from a continuous roll, and printing of flexible substrates such as flexible printed circuit boards.

U.S. Pat. No. 7,650,839 METHOD FOR REGISTERING PATTERNS ON A WEB, to Brost et al. describes a method for registering patterns on a web that is routed over a first roller and a second roller. A registration of a pattern applied to the web is measured and provides an error signal. The error signal is used for controlling lateral and longitudinal position error, and lateral and longitudinal scale error. Independent lateral and longitudinal scale control avoids non-linear distortions. The pattern, applied by a known patterning device such as an inkjet print head, a lithographic device, a flexographic printing device, a screen printing device or a radiant energy beam patterning device, is detected by two cameras or other sensors. Scale control is implemented by changing temperature of the web or tension of the web. A lateral position of process hardware can be adjusted to control lateral position error, and timing can be adjusted to control longitudinal position error.

U.S. Pat. No. 6,753,947 LITHOGRAPHY SYSTEM AND METHOD FOR DEVICE MANUFACTURE, to Meisburger, discloses a continuously moving stage that is used in a lithography system. A metrology device measures the workpiece stage position. An alignment system aligns a mask image projected through a projection lens to a previously deposited masked pattern on the workpiece. A distorted grid is best-fitted to multiple exposure field locations to predict locations of the remaining exposure fields, and takes into account variations in X and Y magnifications, skew, and X and Y keystones. A workpiece is delivered from a workpiece storage unit to the stage. Alignment marks are imaged, a position is analyzed and an offset is measured.

Improvements in an alignment system are sought. Particularly, an improved alignment system is sought which would be usable in various systems and processes involved with various workpieces or with continuous material flow and which would be applicable in aligning a tool to a workpiece having few preprocessing steps or materials applied thereto.

SUMMARY

An alignment system and method, usable in photolithography and lithography and with various tools, makes use of microscopic native features of a workpiece in aligning a tool to the workpiece. The features are imaged on two occasions and the system uses results from the images to align the tool and the workpiece. Between the two occasions, the workpiece may remain at a first location, be removed from the first location and restored to the first location after storage or further processing, or be moved to a second location. In an embodiment having a continuous material flow, the workpiece is moved continuously to and past or through the second location. In lithography and photolithography embodiments, a pattern or an exposure image is imparted to the workpiece with the workpiece or a portion thereof being at the first location, the second location, a third location or a fourth location. Interpolation or extrapolation may be used. A displacement, rotation, distortion or other positioning error of the workpiece may be indicated, with the alignment correcting for the positioning error.

A first embodiment of the method is a method of alignment that controls an alignment of a tool to a workpiece. With the workpiece being at a first location, a plurality of microscopic native features of a surface region of the workpiece are detected by an imaging system at a first occasion. At least one of the plurality of microscopic native features is selected. A period of time elapses between the first occasion and a second occasion.

At the second occasion, the imaging system detects the plurality of microscopic native features of the surface region of the workpiece. The selected at least one microscopic native feature is tracked at the second occasion, with a controller.

Based on the tracking of the selected at least one microscopic native feature, the alignment of the tool to the workpiece is controlled.

The tracking may include pattern matching or determining positioning information or a positioning error. Controlling the alignment of the tool to the workpiece may compensate for a difference between an expected positioning of the workpiece and a determined positioning of the workpiece.

A second embodiment of the method is a method of aligning a tool. A workpiece includes a first region having a plurality of microscopic native features. A first magnified image of the plurality of microscopic native features is captured using an imaging system. For the first image, the workpiece is at a first location.

A time interval passes after the first magnified image is captured, and a second magnified image of the plurality of microscopic native features is captured, using the imaging system. A correspondence is determined between the plurality of microscopic native features of the workpiece as captured in the first and second images.

A controller is used to analyze the microscopic native features having the correspondence between the first and second images. Positioning information of the workpiece is determined, relative to the second image. Based upon the positioning information, an aligning of the workpiece and the tool is performed. The positioning information may include a positioning error, a displacement error, a rotation error or a scale change.

A first embodiment of the system is an alignment system. The alignment system includes an imaging system and a pattern recognition unit.

The imaging system is arranged to capture a first image of a region of a workpiece, with the workpiece being at a first location. The imaging system is further arranged to later capture a second image of the region of the workpiece.

The pattern recognition unit is configured to compare an inherent microscopically visible texture of the workpiece in the first and second images. From the comparing, the pattern recognition unit generates positioning information. The alignment system employs the positioning information in aligning a tool to the workpiece.

A second embodiment of the system is an alignment system for lithography. The alignment system for lithography includes a first high resolution imaging unit, a second high resolution imaging unit and a controller.

The first high resolution imaging unit is configured to capture a first image of a region of the workpiece. For the first image, the workpiece is at a first location.

The second high resolution imaging unit is configured to capture a second image of the region of the workpiece. The second image is captured after the first image is captured.

The controller communicates with the first and second high resolution imaging units. The controller is connectable to a lithography apparatus, and is configured to direct an alignment of the lithography apparatus and the workpiece.

The controller analyzes an inherent microscopically visible texture of the workpiece in the first and second images. By analyzing the texture in the images, the controller determines a positioning error of the workpiece relative to the second image. In response to determining the positioning error, the controller directs the alignment of the lithography apparatus and the workpiece.

A third embodiment of the system is a photolithography system. The photolithography system has a transport mechanism, a machine vision system and projection optics.

The transport mechanism is configured to move a web of material. A region on the web of material travels from a first location through a second location to a third location.

The machine vision system is configured to microscopically image the region at the first location. The machine vision is further configured to microscopically image the region at the second location, the region having traveled to the second location as moved by the transport mechanism. In variations, the region stops at the second location or travels continuously through the second location.

The projection optics are configured to place a projected image on the web of material. The projected image is placed on the web of material at the second location, the third location or a fourth location intermediate between the first and second locations.

The region on the web of material, as imaged at the first location and at the second location, has features belonging to an inherent microscopically visible texture of the region. The projection optics, the transport mechanism and the machine vision system cooperate to align the projected image and the region on the web of material, by analyzing relative displacement of correlated features of the texture in the region as imaged at the first and second locations. A distortion of the web may be determined from analyzing the relative displacement of the correlated features, and a distortion mapping applied to correct the projected image.

BRIEF DESCRIPTION OF THE DRAWINGS

FIG. 10 is a perspective view of a variation of the alignment system of FIG. 1, using a stage to move the workpiece.

FIG. 11 is a perspective view of a continuous web of material, a portion of which is a workpiece suitable for the alignment system of FIG. 1 or a variation thereof.

FIG. 17 is a perspective view showing an act of capturing a first image of a workpiece at a first occasion, suitable for the methods of FIGS. 15A and 16A and the alignment system of FIG. 1 or variation thereof.

FIG. 18 is a perspective view showing the act of capturing a second image of a workpiece, suitable for the methods of FIGS. 15A and 16A and the alignment system of FIG. 1 or variation thereof.

FIG. 19 is a perspective view of a spatial light modulator compensating for positioning error or distortion and suitable for use with the alignment system of FIG. 1 or variation thereof.

DETAILED DESCRIPTION

Figure 1:
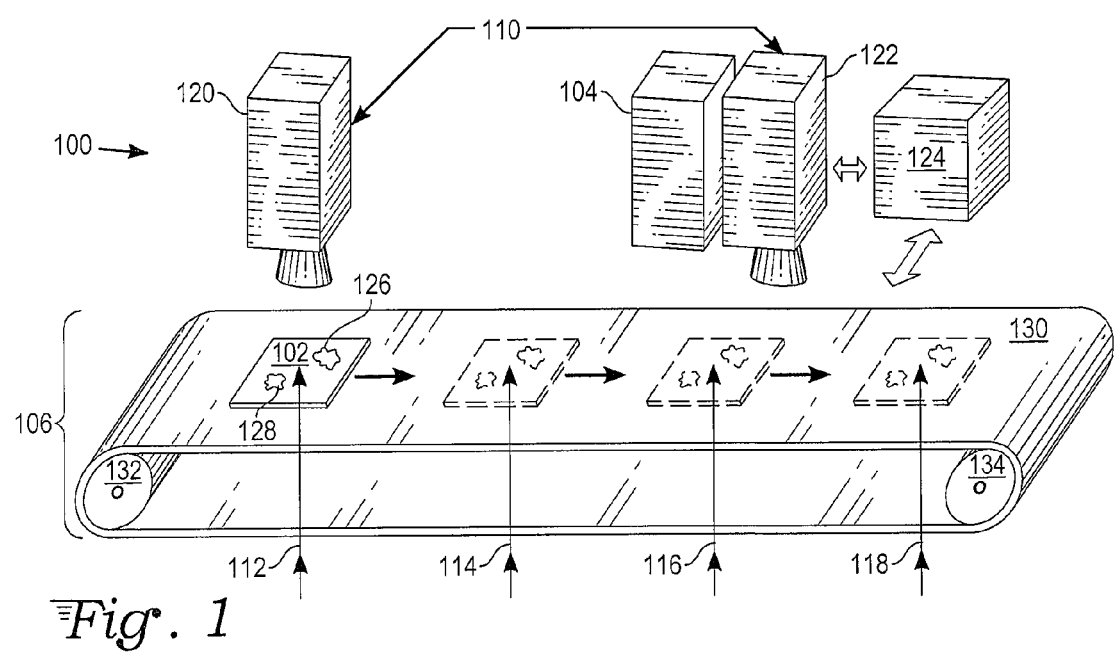
FIG. 1 is a perspective view of an alignment system in accordance with the present invention. A workpiece is shown at multiple locations in interactions with the alignment system.

With reference to FIG. 1, an alignment system 100 in accordance with the present invention is shown, as applied in an embodiment having a continuous material flow. The alignment system 100 is suitable for continuous or discontinuous material flows. Various embodiments of the alignment system 100 maintain alignment of an article that is being moved continuously from a first or reference location to and through a second location, nonstop, an article that is being moved from the first location and stopping at the second location, an article that remains at the first location or an article that is removed from and restored to the first location as for storage or further processing elsewhere. Embodiments of the alignment system 100 are applicable to lithography and photolithography as in printing, semiconductor processing and circuit board processing, and computer-aided manufacturing or other processes requiring precision alignment of an article.

In various embodiments of the alignment system 100, the first and second locations may correspond to different writing or processing areas of a system. While the article is at the first or reference location, each of one or more first high resolution imaging units, such as a camera or a scanner, captures a first set of images of specified regions of the article, on a first occasion. On a second occasion, such as with the article at the first location or when the article has moved to the second location, each of one or more second high resolution imaging units captures a second set of images of respective specified regions of the article corresponding approximately to the image or images captured at the first occasion and at the first or reference location. For example, images can be captured at the respective first and second locations using sets of strobe cameras as the article moves. Imaging analysis means, which may include software, firmware and/or hardware, analyzes inherent texture, graining, granularity or other native features of the article as captured in the images. The image or images acquired at the first or reference location on the first occasion is/are compared with the image or images acquired on the second occasion, and a positioning error of the article relative to the second image is determined. The positioning error of the article relative to the second image is thus relative to the location of the article at the time of the capturing of the second image. The positioning error calculation can include displacement error (e.g. X/Y positioning), rotation error (e.g. angular positioning), and changes in scale due to expansion or contraction of the article. Positioning error calculations can be used as a basis for servo control of the position-to-position article movement, and can also be used as a basis for positional transformations of data used by writing means of the system. The article can be a portion of a continuous web of material, and/or the article can receive processing or otherwise be operated upon during an intermediate operation.

In the embodiment shown in FIG. 1, the alignment system 100 aligns a tool 104 and a workpiece 102. The workpiece 102 is being moved continuously by a transport mechanism 106, from a first location pointed to by an arrow 112 through a second location pointed to by an arrow 116 to at least a third location pointed to by an arrow 118. Intermediate between the first location and the second location is a fourth location pointed to by an arrow 114. An imaging system 110 captures images of the workpiece 102 when the workpiece is at the first location, on a first occasion, and when the workpiece is at the second location, on a second occasion. Using a controller 124 to analyze microscopic native features of the workpiece visible in the captured images, the alignment system 100 derives positioning error information and/or positioning information, and aligns the tool 104 and the workpiece 102.

In various embodiments, the alignment system 100 is a standalone system that communicates with a transport mechanism 106 or variation thereof and communicates with the tool 104, the alignment system 100 is integrated with the transport mechanism 106 and communicates with the tool 104, the alignment system 100 is integrated with the tool 104 and communicates with the transport mechanism 106, or the alignment system 100, the tool 104 and the transport mechanism 106 are integrated as a system. Suitable tools for alignment with a workpiece 102, using the alignment system 100, include mechanical tools such as stamping, machining and paint or ink-based lithography, optical tools such as photolithography exposure systems, laser etching and laser machining and other tools as may be specified or devised by a person skilled in the art.

Suitable workpieces for alignment with a tool 104, using the alignment system 100, include substrates such as printed circuit board materials in various stages of processing, print media such as made of paper, cardboard, various plastics and metals, discrete articles and portions of extended or continuous articles such as a roll of material, a webbing of material or sheets of material of various sizes and aspect ratios. Although the workpiece 102 is shown in FIG. 1 as flat and rectangular, workpieces having other two-dimensional and three-dimensional shapes are suitable for use with the alignment system 100. Regions imaged by the imaging system 110 may be larger or smaller than the region 126 shown in FIG. 1, and may be regularly or irregularly shaped and contiguous or noncontiguous.

The imaging system 110 is arranged to capture a first image of a region 126 of the workpiece 102, with the workpiece being at the first location on a first occasion, and a second image of the region 126 with the workpiece 102 being at the second location on a second occasion. In the embodiment shown in FIG. 1, the imaging system 110 has a first imaging unit 120, such as a high resolution camera with suitable optics, aimed at the first location as pointed to by the arrow 112. The imaging system 110 has a second imaging unit 122, such as a high resolution camera with suitable optics, aimed at the second location as pointed to by the arrow 116. Variations of the imaging system 110 have two or more cameras aimed at the first location and/or two or more cameras aimed at the second location, one or more repositionable cameras, or mirrors or lenses for changing or routing a view of a camera. Lighting is not shown and is readily devised. Mounting hardware is not shown and is readily devised. Although the first imaging unit 120 and second imaging unit 122 are shown in FIG. 1 as having an orthogonal line of sight to the workpiece 102, other mounting angles and/or lines of sight may be employed. In variations, the second imaging unit 122 has a lesser or greater magnification than the first imaging unit 120, and captures images at a correspondingly lesser or greater magnification. Generally, the lesser magnification is useful for tracking larger errors in positioning, and the greater magnification is useful for tracking smaller errors in positioning. Calibration techniques for the imaging units and the imaging system are readily devised, and calibration data is readily incorporated into positioning and error determination.

FIGS. 2-9 depict various captured images of a region 126 of the workpiece 102. The images capture details of inherent microscopically visible texture, graining, granularity or other native features of the workpiece 102, for analysis by the alignment system 100. By identifying, selecting and tracking a subset of the native features as visible in the captured images, the alignment system 100 can derive positioning information about the workpiece 102. The positioning information is relative to the region 126 of the workpiece 102 as captured in the images at the respective times of capture. In an embodiment where the workpiece remains at or is replaced to the first location, the positioning information is relative to the first location. In an embodiment where the workpiece is moved from the first location to the second location, the positioning information is relative to the first location and the second location. Conversions among coordinate systems and conversions between moving and stationary coordinate systems are readily devised.

In a variation, macroscopically visible texture, graining, granularity or other native features can be captured in the images and used for analysis. In further variations, microscopically or macroscopically visible texture, graining, granularity or other native features can be captured in images along with conventionally deposited alignment targets, and this combination is used for analysis in coarse alignment and fine alignment.

Figure 2:
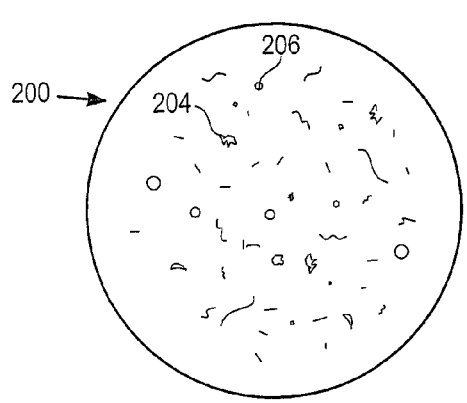
FIG. 2 is a first image of a region of the workpiece, the image being captured by the alignment system of FIG. 1 on a first occasion with the workpiece at a first location.

As shown in FIG. 2, the first image 200, as captured by the imaging system 110 with the workpiece 102 being at the first location in a first occasion, has a plurality of native features of the workpiece 102 visible in a region 126 of the workpiece 102 within the view field of the image. For example, a first native feature 204 and a second native feature 206 are among the plurality of native features visible in the first image 200. The first image 200 establishes a reference positioning of the workpiece 102, relative to the first location and the first occasion.

Various factors may act on the workpiece 102, as the workpiece travels from the first location to and past the second location. Manufacturing tolerances, wear and tear on mechanisms, alignment tolerances on machinery in multiple subsystems, thermal expansion or contraction in the transport mechanism 106, adjustment precision in setup or maintenance of systems and so on affect the positioning of the workpiece 102. Thermal expansion or contraction of the workpiece 102 itself, or relative changes in the workpiece 102 as a result of further processing from intermediate steps further affect the positioning of the workpiece.

As shown in FIGS. 3-9 a second image 300; 400; 500; 600; 700; 800; and 900, as captured by the imaging system 110 in a second occasion, has the plurality of native features of the workpiece 102 visible in the region 126 of the workpiece 102 within the view field of the image. In an embodiment having the workpiece 102 moving from the first location to the second location, a workpiece 102 at an essentially perfect alignment with the workpiece at the second location, assuming essentially perfect duplication of imaging system 110 characteristics and capabilities from the first location to the second location, would result in the second image being an essentially exact duplicate of the first image 200. However, as can be seen in the various examples of a second image, shifts in the positioning of the workpiece 102 are observable in the second image as changes in relative positioning of the native features from the first image to the second image. It is not necessarily the case that all features visible in the first image 200 will be visible in the second image.

Figure 3:
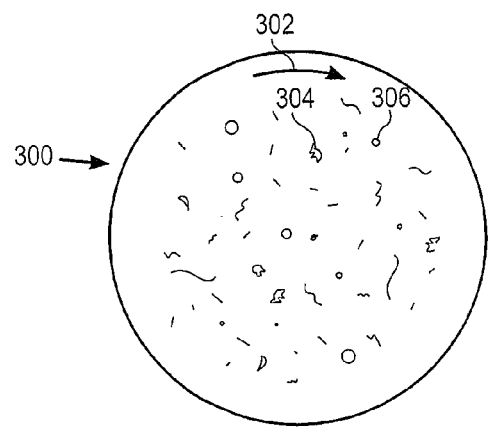
FIG. 3 is a first example of a second image of the region of the workpiece, as captured by the alignment system of FIG. 1 on a second occasion subsequent to the first captured image of FIG. 2. The image shows a rotation of the workpiece has occurred.

With reference to FIG. 3, the workpiece 102 has rotated in a clockwise direction 302, as observed in a clockwise rotation of native features of the workpiece in the first example of a second image 300. As seen in the first example of a second image 300, the first native feature 304 and the second native feature 306 have shifted relative to the corresponding positionings in the first image 200.

Figure 4:
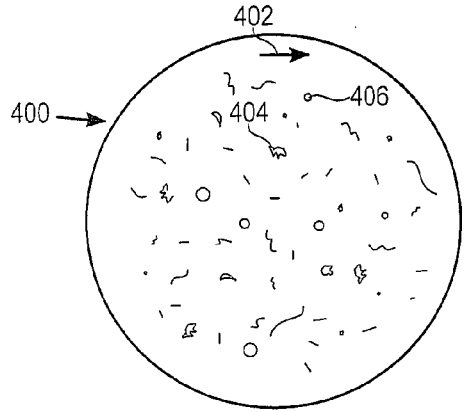
FIG. 4 is a second example of a second image of the region of the workpiece, as captured by the alignment system of FIG. 1 on a second occasion subsequent to the first captured image of FIG. 2. The image shows a lateral displacement of the workpiece in a forward direction.

With reference to FIG. 4, the workpiece 102 has moved in a rightward direction 402 (relative to the drawing orientation), as observed in a rightward translation of native features of the workpiece in the second example of a second image 400. As seen in the second example of a second image 400, the first native feature 404 and the second native feature 406 have shifted relative to the corresponding positionings in the first image 200.

Figure 5:
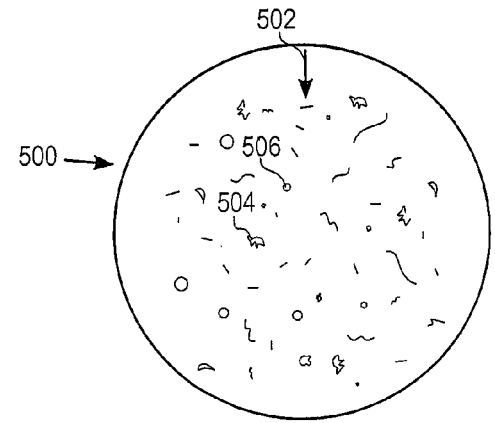
FIG. 5 is a third example of a second image of the region of the workpiece, as captured by the alignment system of FIG. 1 on a second occasion subsequent to the first captured image of FIG. 2. The image shows a lateral displacement of the workpiece in a sideways direction.

With reference to FIG. 5, the workpiece 102 has moved in a downward direction 502 (relative to the drawing orientation), as observed in a downward translation of native features of the workpiece in the third example of a second image 500. As seen in the third example of a second image 500, the first native feature 504 and the second native feature 506 have shifted relative to the corresponding positionings in the first image 200.

Figure 6:
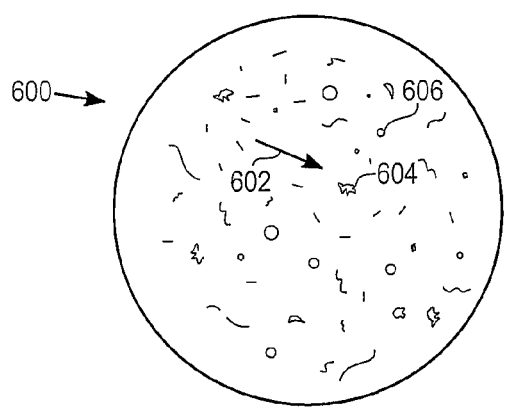
FIG. 6 is a fourth example of a second image of the region of the workpiece, as captured by the alignment system of FIG. 1 on a second occasion subsequent to the first captured image of FIG. 2. The image shows a lateral displacement of the workpiece in a diagonal direction.

With reference to FIG. 6, the workpiece 102 has moved in a right diagonally downward direction 502 (relative to the drawing orientation), as observed in a right diagonally downward translation of native features of the workpiece in the fourth example of a second image 600. As seen in the fourth example of a second image 600, the first native feature 604 and the second native feature 606 have shifted relative to the corresponding positionings in the first image 200.

Figure 7:
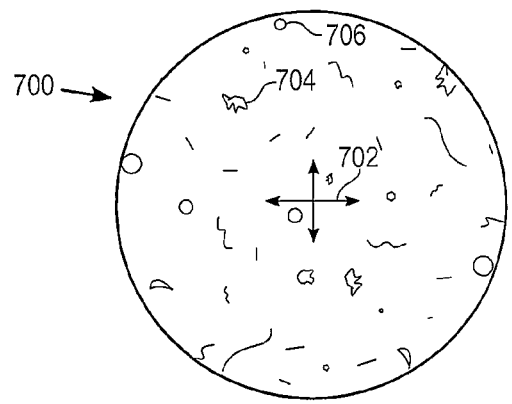
FIG. 7 is a fifth example of a second image of the region of the workpiece, as captured by the alignment system of FIG. 1 on a second occasion subsequent to the first captured image of FIG. 2. The image shows a distortion of the workpiece from expansion.

With reference to FIG. 7, the workpiece 102 has expanded uniformly in an expansion direction 702, as observed in a spreading apart of native features of the workpiece in the fifth example of a second image 700. As seen in the fifth example of a second image 700, the first native feature 704 and the second native feature 706 have shifted relative to the corresponding positionings in the first image 200.

Figure 8:
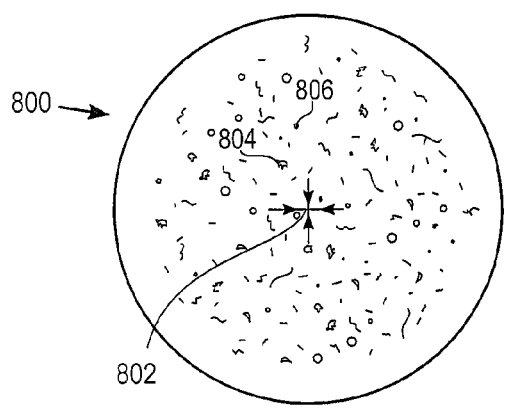
FIG. 8 is a sixth example of a second image of the region of the workpiece, as captured by the alignment system of FIG. 1 on a second occasion subsequent to the first captured image of FIG. 2. The image shows a distortion of the workpiece from contraction.

With reference to FIG. 8, the workpiece 102 has contracted uniformly in a contraction direction 802, as observed in a moving closer together of native features of the workpiece in the sixth example of a second image 800. As seen in the sixth example of a second image 800, the first native feature 804 and the second native feature 806 have shifted relative to the corresponding positionings in the first image 200.

Figure 9:
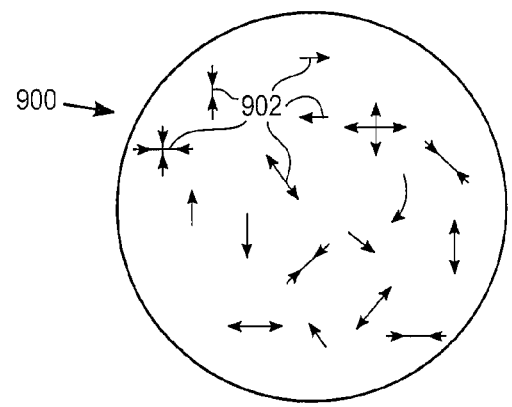
FIG. 9 is a seventh example of a second image of the region of the workpiece, as captured by the alignment system of FIG. 1 on a second occasion subsequent to the first captured image of FIG. 2. The image shows a distortion of the workpiece from multiple factors.

With reference to FIG. 9, the workpiece 102 has undergone a plurality of distortions. Individual ones of the native features have undergone individual displacements in a variety of directions. For clarity, the arrows 902 indicate the displacement directions and the native features are not shown in the drawing. By tracking multiple native features, the alignment system 100 can generate positioning information that indicates a complex distortion.

With reference back to FIG. 1, a controller 124 controls alignment to the workpiece, based on tracking at least one of the plurality of microscopic native features. As used herein, a controller is broadly defined as a machine or part of a machine that controls a process. Applicable processes for the controller 124 to control include imaging, processing, analyzing, recognizing, selecting, tracking, determining, calculating, providing data, operation of algorithms, controlling, aligning, and other processes as appropriate to an embodiment. The controller 124 may be implemented in hardware, software, firmware or a combination thereof. In various embodiments, the controller 124 may include or be part of an image system, a machine vision system, a pattern recognition system, a pattern recognizer, a tracking system, a tracker, or a computer-aided manufacturing (CAM) system and is not limited to being or including a particular commercially available controller, processor, microprocessor or microcontroller. In various embodiments, in controlling an alignment to the workpiece, the controller 124 directly controls the tool, directs an alignment of the tool and the workpiece and/or provides data that is used by a self-moving tool or tooling system that is otherwise independent from the alignment system. Other combinations and variations may be devised.

In a first embodiment, the controller 124 includes a pattern recognition unit configured to compare an inherent microscopically visible texture of the workpiece 102 in the first and second images, from which the pattern recognition unit generates positioning information. In one variation, the controller 124 employs the positioning information in aligning a tool to the workpiece. In a further variation, the controller 124 communicates the positioning information to a tool or to a further device operating a tool, and the tool or the device aligns the tool to the workpiece. The alignment system thus employs the positioning information in aligning the tool to the workpiece.

In a second embodiment, the controller 124 communicates with the imaging system 110 and is connectable to or is connected to a tool, such as a lithography apparatus. The controller 124 is configured to direct an alignment of the tool and the workpiece in response to determining a positioning error of the workpiece relative to the second image. The controller 124 analyzes an inherently microscopic visible texture of the workpiece in the first and second images.

In a third embodiment, the controller 124 includes a machine vision system configured to microscopically image a region 126 of the workpiece 102 with the region 126 of the workpiece 102 being at the first location and subsequently with the region 126 of the workpiece 102 being at the second location. The machine vision system cooperates with the transport mechanism 106 and the tool 104 to align the tool or an aspect of the tool and the region 126 of the workpiece 102, by analyzing relative displacement of correlated features belonging to an inherent microscopically visible texture of the region as imaged at the first and second locations. In a variation, the tool is a photolithography apparatus with projection optics, and the aspect of the tool that is aligned with the workpiece is a projected image.

FIGS. 1 and 10-14 show various examples of transport mechanisms, workpieces, arrangements, instances and locations of tools being aligned to a workpiece, as suitable for use in or with the alignment system 100. Transport mechanisms can include manual, robotic or other automated handling (e.g. a robotic handler such as known in the art) and can be distinct from or integrated with a tool. A workpiece can be compact or extended. An imaged region of a workpiece and a region of the workpiece with which a tool is aligned can be distinct and separate, contiguous, overlapping or identical. Alignment of a tool and a region of a workpiece can be performed in a first instance with the region being at the second location, in a second instance with the region being at the third location, and/or in a third instance with the region being at the fourth location, with variations according to workpiece extent and relationship between imaged region and aligned region, as will be described generally and further with reference to each of FIGS. 1 and 10-14.

In the first instance, with the region to be aligned being at the second location, the positioning information and/or positioning error can be applied directly to the alignment, adjusted for offset between the region to be aligned and the imaged region.

In the second instance, with the region to be aligned being at the third location, the positioning information and/or positioning error can be extrapolated and applied to the alignment, further adjusted for offset between the region to be aligned and the imaged region. The extrapolation of the positioning information and/or positioning error is a prediction of positioning error based upon modeling of positioning error trend, and may be a linear extrapolation, a curve-fitted extrapolation, an empirically-based extrapolation or an extrapolation based on a further model or technique as devised by a person skilled in the art.

In the third instance, with the region to be aligned being at the fourth location, between the first and second locations, the positioning information and/or positioning error can be interpolated and applied to the alignment, further adjusted for offset between the region to be aligned and the imaged region. The interpolation of the positioning information and/or positioning error is a prediction of positioning error based upon modeling of positioning error trend, and may be a linear interpolation, a curve-fitted interpolation, an empirically-based interpolation or an interpolation based on a further model or technique as devised by a person skilled in the art.

A compact workpiece, or selection of a region to be aligned as sufficiently close to, overlapping or identical to a region to be imaged, can make use of the alignment system 100 as in the second instance described above, with positioning information applied directly to the alignment. An extended workpiece and selection of a region to be aligned and a region to be imaged that are sufficiently spaced apart, or multipart workpieces, are candidates for extrapolation or interpolation as above. The design decision as to the use of directly applied, extrapolated or interpolated positioning information is situation-dependent, and the alignment system 100 can use such depending upon the application. An extrapolation or an interpolation can result in a nonzero or a zero factor, amount or vector to be applied to the positioning information and/or positioning error, the magnitude of which factor, amount or vector may depend on system tolerances, alignment tolerances or requirements or other factors of design or application.

Workpiece regions and transport mechanisms are discussed below, with reference to FIGS. 1 and 10-14.

With reference back to FIG. 1, a transport mechanism 106 for continuous material flow is shown as having a conveyor belt 130 looped around end rollers 132 and 134. The workpiece 102 is shown in FIG. 1 as a discreet article movable from one location to another by the transport mechanism 106. The first region 126 of the workpiece 102 is imaged by the imaging system 110 as described, and the tool 104 is aligned with a second region 128 of the workpiece 102. The second region 128 is shown as separated from the first region 126. In variations, the second region 128 can be closer to, contiguous with, overlap or be identical to the first region 126. In further variations, the second region 128 can be at a greater distance from the first region 126 than shown in FIG. 1. In various orientations of the regions, the first and second regions can be side-by-side, the second region can follow the first region or the first region can follow the second region as the workpiece 102 is moved continuously by the transport mechanism 106. For example, in one orientation the second region 128 can precede the first region 126 in arriving at and passing through the second location.

With reference to FIG. 10, a stage 1004 of a transport mechanism is shown, as a variation of the transport mechanism 106. Other details of this variation of the transport mechanism 106, such as mountings, motors, gears, base, housing and so on are not shown and are readily devised. The stage 1004 moves continuously from a first location 1020 of the stage 1004 and the workpiece 102, through a second location 1024 of the stage 1004 and the workpiece 102 (shown in dashed lines) to at least a third location 1026 of the stage 1004 and the workpiece 102 (shown in dashed lines), passing through a fourth location 1022 intermediate between the first location and the third location.

Alignment of a tool and a workpiece and interactions of the tool and the workpiece as depicted in FIG. 10 are applicable to the alignment system 100, including variations of the transport mechanism 106 of FIG. 1 such as a transport mechanism having a stage as shown in FIG. 10 and various types and shapes of workpieces as have been and will be described. In FIG. 10, details of the imaging system 110 are not shown, and can be devised with reference to FIG. 1 and variations.

As has been described with reference to FIG. 1, the alignment system 100 determines a positioning error and/or positioning information of the workpiece relative to the location of the workpiece at the time of the capturing of the second image. The alignment system aligns a tool or an aspect of the tool and the workpiece, based upon the positioning error and/or positioning information as determined relative to the second image. Such alignment of a tool or an aspect of the tool and the workpiece can take place at one or more locations.

With reference to FIG. 10, in a first instance of a location for alignment, the workpiece 102 is at the second location 1024. The tool 1008 or the tool 1010 is aligned by the alignment system 100, based directly upon the positioning error and/or positioning information as determined relative to the second location. The positioning error and/or positioning information can be used directly, as the tool 1008 or the tool 1010 is applied to the workpiece 102 coincident with or very close to the region that was imaged in order to determine the positioning error.

With ongoing reference to FIG. 10, in a second instance of a location for alignment, the workpiece 102 is at the third location 1026. The positioning error determined relative to the second location is extrapolated to predict a positioning error relative to the third location, and is applied in aligning the tool 1012 and the workpiece 102 at the third location 1026.

With still further reference to FIG. 10, in a third instance of a location for alignment, several variations apply. The workpiece 102 (shown), a region of the workpiece or an article of a multipiece workpiece is at the fourth location 1022 intermediate between the first location 1020 and the second location 1024. The positioning error, determined relative to a further workpiece, a further region of the workpiece or a further article of a multipiece workpiece and relative to the second location 1024, is interpolated to predict a positioning error relative to the fourth location 1022, and is applied in aligning the tool 1006 and the workpiece 102 or variation thereof at the fourth location 1022. Thus, in the first variation in this third instance, one workpiece has a positioning error determined with the one workpiece being at the second location, and a further workpiece has a tool aligned with the further workpiece being at the fourth location. In a second variation in this third instance, an extended workpiece has a region imaged at the second location and a positioning error determined relative to that region being at the second location. A further region of the extended workpiece has the tool aligned with the further region being at the fourth location. In the third variation in this third instance, a multipiece workpiece has a first article imaged at the second location, and a positioning error determined relative to that first article at the second location. A second article of the multipiece workpiece has the tool aligned to the second article at the fourth location.

With reference to FIG. 11, an example is shown of a workpiece 1140 and a transport mechanism 1100, suitable for use with the alignment system 100 or variation. The workpiece 1140 is undergoing continuous material flow, and is a portion of a continuous web of material 1110. A beginning roll 1112 sources or dispenses the continuous web of material 1110 and portions thereof, and an end roll 1114 takes up or rolls up the continuous web of material 1110 and portions thereof. Spools, gears, rate and/or position control mechanisms and other subsystems of the transport mechanism 1100 are not shown and are readily devised. In a variation, the continuous web of material 1110 is drawn through pinch rollers and cut into portions for distribution or further processing as separated workpieces.

As the workpiece 1140 moves from the workpiece being at the first location 1102, a first region 1120 of the workpiece and a second region 1122 of the workpiece 1140 travel as part of the workpiece 1140 and undergo relative positional changes as a result of flexing, stretching, contraction and other movements and distortions of the continuous web of material 1110. The first region 1120 and the second region 1122 of the workpiece 1140 also undergo relative positional changes as a result of further aspects of the transport mechanism, as have been previously and generally discussed, e.g. mechanism wear, set up imprecision, adjustments and manufacturing tolerances.

Similarly to previously discussed examples, the workpiece 1140 moves continuously from the workpiece being at the first location 1102 to and past the workpiece being at the second location 1106 through at least the workpiece being at the third location 1108. The first region 1120 of the workpiece 1140 is imaged with the workpiece being at the first location 1102 and is further imaged with the workpiece being at the second location 1106, with the imaging system 110 (see FIG. 1, not shown in FIG. 11) capturing a first image and a second image respectively. A positioning error of the workpiece 1140 is determined, relative to the second location and relative to the first region 1120 of the workpiece 1140. In at least a first, a second and a third instance, a tool is aligned with the workpiece, based upon the positioning error determined relative to the second location.

In the first instance of alignment, the first region 1128 of the workpiece is at the second location, with the workpiece itself being at the second location 1106. The second region 1130 of the workpiece is considered to be at the second location and the positioning information is used directly in aligning a tool (not shown) to the second region 1130 at the second location. Alternatively, when the workpiece is considered to be an extended workpiece and the second region 1130 is considered insufficiently close to the first region 1128, the second region 1130 of the workpiece is considered to be at a fourth location between the first location and the second location, and interpolation of the positioning information is used in aligning a tool (not shown) to the second region 1130 at the fourth location, as in the third instance of alignment.

In the second instance of alignment, the second region 1134 of the workpiece is at the third location. Two variations allow for such a configuration. In the first variation, as shown in FIG. 11, the workpiece is at the third location 1108, having passed the second location. Positioning information derived from imaging the first region with the workpiece being at the first location 1102 and being at the second location 1106 is extrapolated and used to align a tool (not shown) to the second region 1134 at the third location. In a second variation, an extended workpiece (outline not shown but may be derived with the aid of FIG. 11) has a first region 1128 at the second location 1106 and a second region 1134 at the third location 1108. Positioning information derived from imaging the first region 1128 at the second location 1106 is extrapolated and used to align a tool (not shown) to the second region 1134 at the third location.

In the third instance of alignment, the second region 1126 of the workpiece is at the fourth location. Two variations allow for such a configuration. In the first variation, as shown in FIG. 11, the workpiece is considered a multipart workpiece, with the portion of the workpiece being at the fourth location 1104 considered as a second article of a multipart workpiece, and the portion of the workpiece being at the second location 1106 considered as a first article of a multipart workpiece. The first region 1128 of the workpiece being at the second location 1106 is imaged and considered as an imaging at the second location of the first region of the first article of the multipart workpiece. Positioning information derived from this imaging is interpolated and applied in aligning a tool (not shown) to the second region 1126 with the workpiece being at the fourth location 1104 and considered as an alignment at the fourth location to the second region 1126 of the second article of the multipart workpiece. In the second variation, the workpiece is an extended workpiece (outline not shown but may be derived with the aid of FIG. 11), having the first region 1128 imaged at the second location 1106 and having the second region 1126 at the fourth location 1104 for alignment. Positioning information is interpolated and applied in aligning a tool (not shown) to the second region 1126 at the fourth location 1104.

Figure 12:
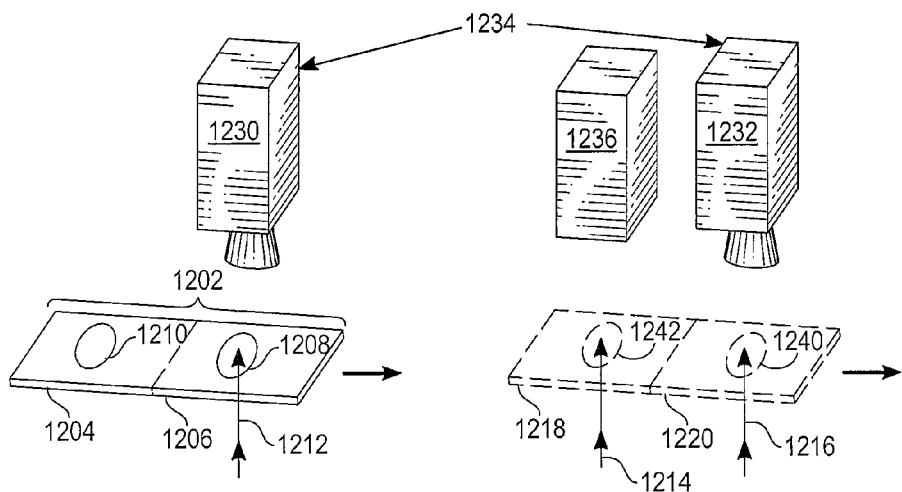
FIG. 12 is a perspective view of an extended or two-part workpiece suitable for the alignment system of FIG. 1 or variation thereof, and showing a portion of such a system.

With reference to FIG. 12, an extended or multipart workpiece 1202 includes a first article 1206 with a first region 1208 and a second article 1204 with a second region 1210. The extended or multipart workpiece 1202 is at a first location 1212. The second region 1210 is a candidate for alignment to the tool 1236, using a variation of the alignment system 100.

An imaging system 1234 uses a first imaging unit 1230 and captures a first image (not shown) of the first region 1208, with the first region 1208, the first article 1206, and the extended or multipart workpiece 1202 being at the first location 1212. A continuous material flow transport mechanism (not shown) as readily devised moves the extended or multipart workpiece 1202 from the first location 1212 to and past the second location 1216. The imaging system 1234 uses a second imaging unit 1232 and captures a second image (not shown) of the first region 1240 at the second location 1216, with the first region 1240 and the first article 1220 being at the second location 1216 and the second region 1242 and the second article 1218 being at the fourth location 1214, between the first location and the second location. Positioning information and/or positioning error is derived from analysis of the first and second images as previously described, and applied in aligning the tool 1236 to the second region 1242 at the fourth location 1214. Interpolation of the positioning information and/or positioning error is applied. In variations and other instances of alignment, the first article 1206 and the second article 1204 can be separated, reversed from the orientation shown, have a tool aligned to a region with the region being at a further location, have further articles associated with the multipart workpiece and so on.

Figure 13:
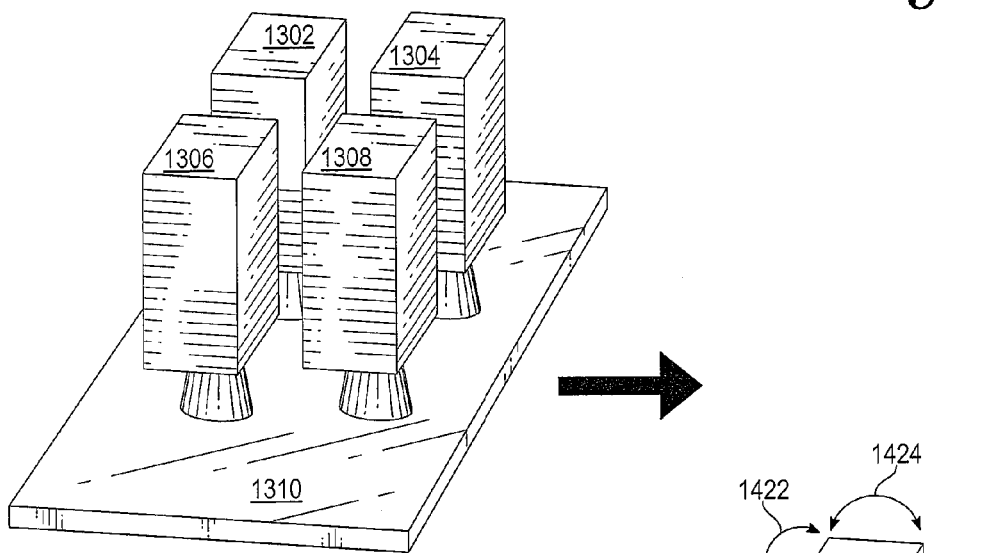
FIG. 13 is a perspective view of a variation of an imaging system suitable for the alignment system of FIG. 1 or variation thereof.

With reference to FIG. 13, a variation of the imaging system 110 is shown. A plurality of imaging units 1302, 1304, 1306 and 1308 are applied to image respective regions of a workpiece 1310. The imaging units 1302, 1304, 1306 and 1308 are arranged in an orthogonal array and can generate more accurate positioning information than can a single imaging unit having resolution comparable to one of the plurality of imaging units.

In further variations of the imaging system 110, an imaging unit captures multiple images sequentially in time, an imaging unit captures multiple images in parallel as with multiple lenses or mirrors, an imaging system combines a single imaging unit at one location and multiple imaging units at another location, an imaging unit can be aimed at more than one location, and imaging units are arranged in nonorthogonal arrays. The imaging system 110 can include one or more strobe cameras, such as a first strobe camera aimed at the first location and a second strobe camera aimed at the second location. Two or more imaging units can be arranged to capture images of the workpiece with the workpiece being at a specified location.

Figure 14:
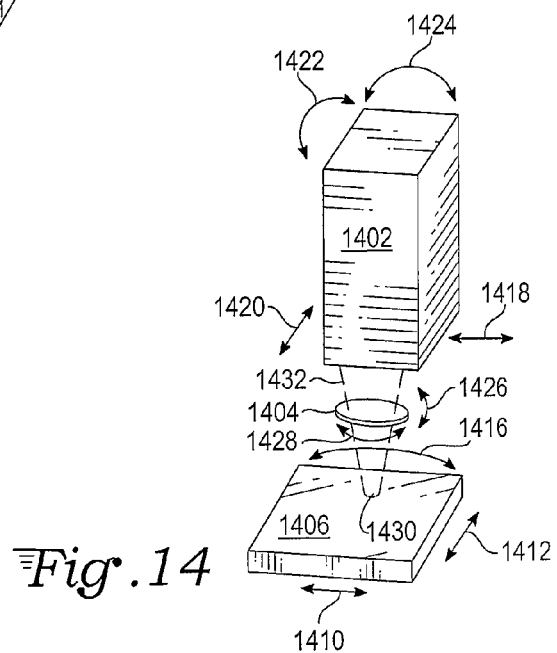
FIG. 14 is a perspective view of a photolithographic apparatus projecting an exposure image onto the workpiece. The apparatus is suitable for use as a tool to be aligned with the workpiece, in or with the alignment system of FIG. 1 or variation thereof.

With reference to FIG. 14, an example of a tool aligned with a workpiece 1406 is shown, as the tool performs a process on the workpiece 1406. The tool is a photolithography apparatus 1402, and is suitable for alignment with the workpiece 1406 using the alignment system 100 or variation thereof. A pattern is being imparted to a region 1430 on the workpiece 1406, by the photolithography apparatus 1402. A pattern can be projected onto the workpiece from projection optics of the photolithography apparatus 1402, including for example a mask or a spatial light modulator. In order to align the photolithography apparatus 1402 and the workpiece 1406, the workpiece 1406 can be repositioned, the photolithography apparatus 1402 can be repositioned, an aspect of the photolithography apparatus 1402 can be adjusted, or a combination thereof can be applied. In repositioning the workpiece 1406, a lateral positioning of the workpiece 1406 can be adjusted as by moving the workpiece 1406 in a right-left direction 1410, in a fore-and-aft direction 1412 or in a rotation direction 1416. In repositioning the photolithography apparatus 1402, a lateral positioning of the photolithography apparatus 1402 can be adjusted as by moving the photolithography apparatus 1402 in a right-left direction 1418 or in a fore-and-aft direction 1420, or an angular positioning of the photolithography apparatus 1402 can be adjusted as by tilting the photolithography apparatus 1402 in a side-to-side tilting direction 1424 or a front-to-back tilting direction 1422. A suitable aspect of a photolithography apparatus 1402 to be adjusted in order to effect an alignment is an optical path 1432 of a projected image (projected image not shown). As an example, the optical path 1432 is adjusted by tilting a lens 1404 or other optical element in either of two orthogonal tilting directions 1428 and 1426. Combinations of the above and/or diagonal or other angled adjustments may be devised. Other techniques, mechanisms, angles and so on for positioning the workpiece 1406 and positioning the photolithography apparatus 1402 can be devised by a person skilled in the art. The projected image and associated pattern to be aligned with and imparted to the workpiece can be larger or smaller than the region to which the pattern is aligned, and can overlap or be adjacent to such a region.

As the photolithography apparatus 1402 example of FIG. 14 shows, a tool, an aspect of a tool, a workpiece or combinations thereof can be repositioned, adjusted, moved or aimed in various ways as can be devised, in applying the disclosed method of alignment, alignment system, photolithography system and variations. Various transport mechanisms, tools, mountings, groupings of assemblies, communications mechanisms, fine and coarse positioning mechanisms and so on are applicable.

As an example, in a photolithography system, projection optics such as in the photolithography apparatus 1402 of FIG. 14, a transport mechanism 106 of FIG. 1 and a machine vision system such as described with reference to controller 124, cooperate to align a projected image and the region 126 of the workpiece 102.

Figure 15A:
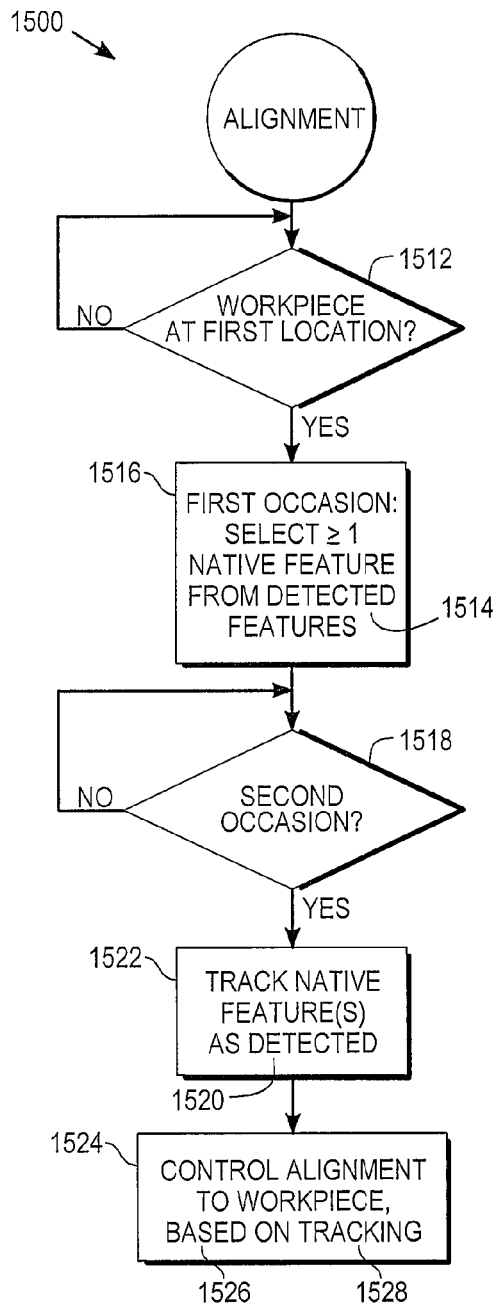
FIG. 15A is a flow diagram of a method of alignment, suitable for use with the alignment system of FIG. 1 or variation thereof.
Figure 15B:
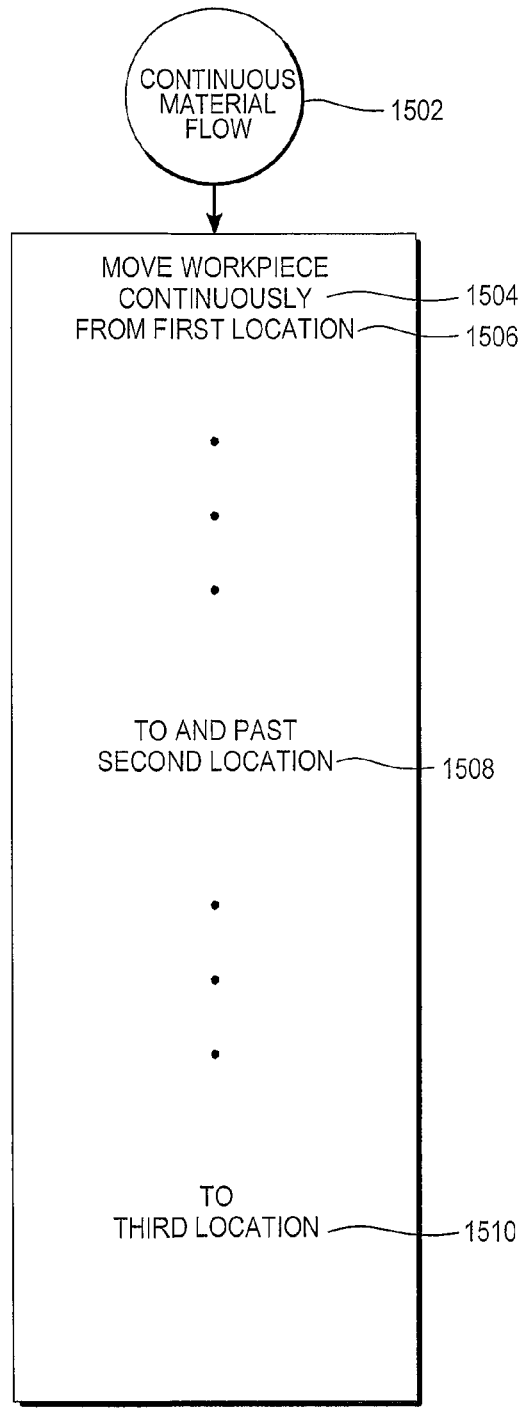
FIG. 15B is a flow diagram of a method of a continuous material flow, suitable for use with the method of FIG. 15A and the alignment system of FIG. 1 or variation thereof.

With reference to FIGS. 15A and 15B, a method 1500 of alignment that may be practiced with or without using a continuous material flow 1502 is shown. The method 1500 makes use of various processes involving microscopic native features of a surface region of a workpiece, as imaged with the workpiece being at each of two locations. Various members of an alignment system interacting with or including a tool and interacting with a workpiece implement the various acts of the method.

In the continuous material flow 1502, the workpiece is moved continuously 1504 from a first location 1506 to and past a second location 1508 to a third location 1510. The workpiece does not stop at the second location. In variations, the workpiece does or does not stop at the first location and the workpiece does or does not stop at the third location.

As a contrasting example, in a discontinuous material flow (not shown), the workpiece stops at the second location en route to the third location. In a further example of a discontinuous material flow, the workpiece stops at the fourth location en route to the second location.

According to the method 1500, at a first occasion when the workpiece is at the first location 1512, microscopic native features of a surface region of the workpiece are detected 1514 by an imaging system. At least one of the native features is selected 1516.

After a time period has passed, at the second occasion 1518, the selected native feature is detected 1520 by the imaging system, and the selected native feature is tracked 1522. In variations, at the second occasion the workpiece may be at the first location or at the second location.

Alignment to the workpiece is controlled 1524, based 1526 on the tracking 1528 of the selected native feature. In a variation, more than one native feature is selected and tracked, and the alignment is based on the tracking of the selected native features.

In one variation, tracking includes pattern matching. A pattern of native features from the first image is matched in the second image, using pattern matching, such as best fit, best match, pattern recognition or other algorithms or technology.

In one variation, the alignment to the workpiece is controlled in a lithographic apparatus. A photolithographic apparatus is a type of lithographic apparatus, and is a further candidate for the alignment to the workpiece. A lithographic apparatus can impart a pattern to the workpiece with the workpiece being at the first location, the second location, the third location or the fourth location and the alignment being controlled as described. An exposure image can be projected onto the workpiece, as by a photolithographic apparatus, with the workpiece being at one of the above-described locations and the exposure image being aligned with the workpiece by the controlling of the alignment.

In one variation, an expected positioning of the workpiece at the second occasion is compared to a determined positioning of the workpiece at the second occasion. Controlling the alignment to the workpiece compensates for a difference between an expected positioning and the determined positioning. The difference between the expected positioning and the determined positioning is a positioning error. Thus, controlling the alignment to the workpiece compensates for the positioning error. Expected positioning, determined positioning and positioning error are types of positioning information.

In one variation, a distortion of the workpiece is determined, based on the tracking of the microscopic native feature or features. Tracking of a greater number of native features allows determination of more complex distortion of the workpiece. In a related variation, controlling the alignment of the workpiece compensates for the distortion of the workpiece.

Figures 16A, 16B:
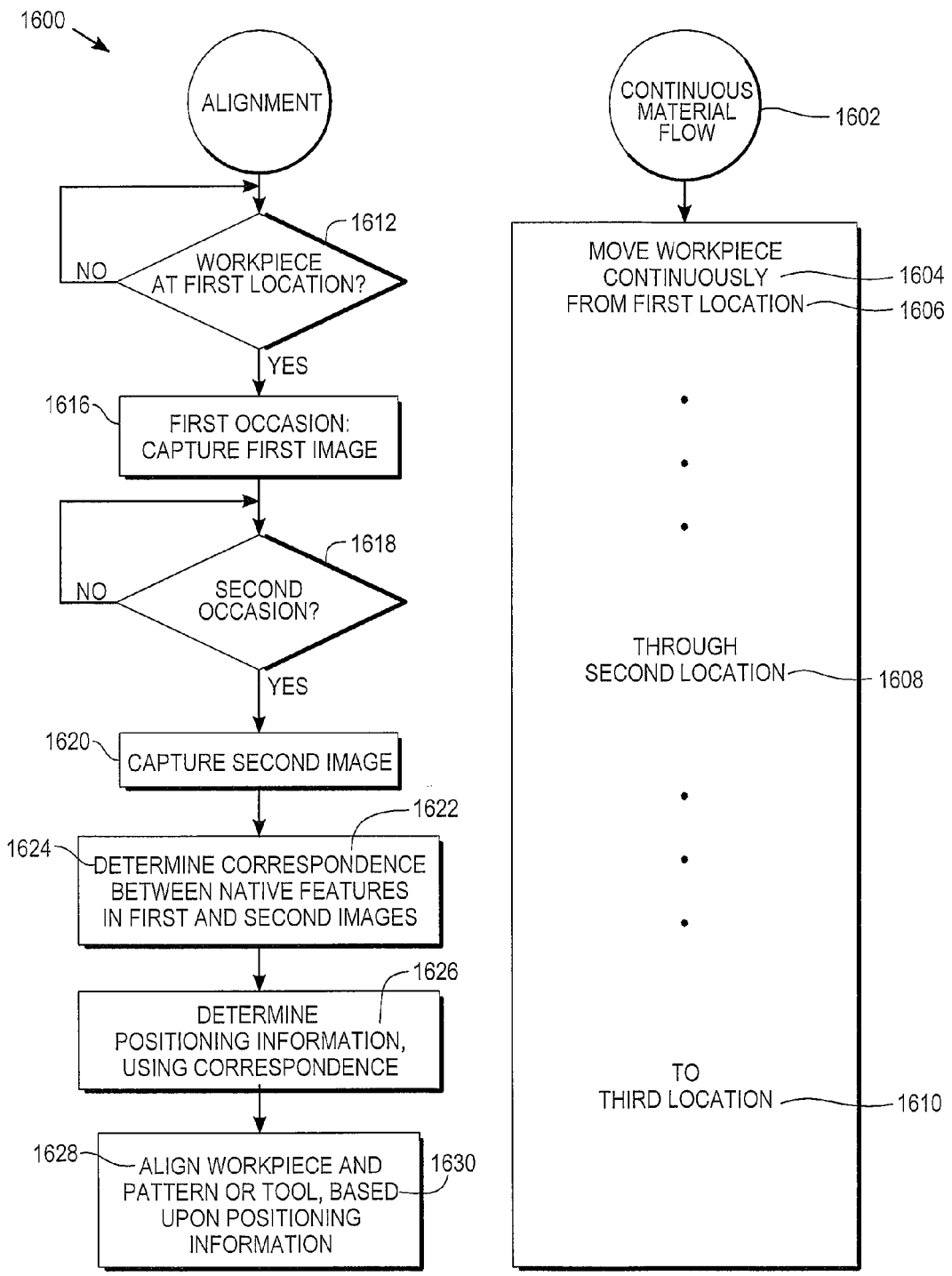
FIG. 16A is a flow diagram of a further method of alignment, in a lithographic apparatus and suitable for use with the alignment system of FIG. 1 or variation thereof.
FIG. 16B is a flow diagram of a method of a continuous material flow, suitable for use with the method FIG. 16A and the alignment system of FIG. 1 or variation thereof.

With reference to FIGS. 16A and 16B, a method 1600 of alignment in a lithographic apparatus is shown. The method 1600 may be practiced with or without using a continuous material flow 1602. The method 1600 is a variation of the method 1500 of alignment shown in FIG. 15A, and is applied to a lithographic apparatus, which is a suitable tool for precision alignment with a workpiece. The lithographic apparatus imparts a pattern to the workpiece, such as a printed ink or paint pattern in printed lithography, or an exposure pattern in photolithography. For accurate lithography, the pattern should be aligned with the workpiece. The pattern is imparted to the workpiece after the alignment, as attempting to align with the workpiece after the pattern has been imparted would result in the pattern imparted to the workpiece not being as precisely aligned with the workpiece.

In the continuous material flow 1602 of the lithographic apparatus, the workpiece is being moved continuously 1604 from a first location 1606 through a second location 1608 to at least a third location 1610. The workpiece is not stopping at the second location. In variations, the workpiece moves from a standing start or a moving start at the first location, and moves to a stop at the third location or continues moving through the third location.

According to the method 1600, at a first occasion a first magnified image is captured 1616, using an imaging system. For the first image, the workpiece is at the first location 1612. Microscopic native features of a first region of the workpiece are captured in the first image.

A second magnified image is captured 1620 at a second occasion 1618, using the imaging system. For the second image, in variations the workpiece may be at the first location or at the second location. The microscopic native features of the first region of the workpiece are further captured in this second image.

A correspondence 1622 is determined 1624 between the native features as captured in the first and second images.

A positioning information 1626 of the workpiece is determined. The positioning information is relative to the second location, and uses the correspondence determined between native features captured in the first and second images, in analyzing the images.

The workpiece and a tool are aligned 1628, based 1630 upon the positioning information. In a variation, the workpiece and a pattern, such as from a lithography apparatus, are aligned based upon the positioning information.

In one variation, determining the correspondence between the native features in the first and second images and/or determining a positioning information includes applying a pattern matching to the images. The pattern matching is applied to the images to determine if the same native feature appears in both the first and second images or to determine if the same native feature has moved in the second image relative to the first image.

In one variation, more than one magnified image of the workpiece is captured on the first occasion, and more than one magnified image of the workpiece is captured on the second occasion.

The positioning error includes a displacement error, a rotation error, and/or a scale change or other distortion information. In one variation, the positioning error of the workpiece includes a first positioning error of a first microscopic native feature and a second positioning error of a second microscopic native feature of the workpiece.

In variations, aligning the workpiece and the pattern to be imparted to the workpiece by the lithographic apparatus is accomplished in various manners. A lateral positioning of the workpiece can be adjusted. In a photolithographic apparatus having a projection optics unit that imparts the pattern to the workpiece, a timing of an exposure can be adjusted to compensate for the positioning error. In a photolithographic apparatus having a spatial light modulator that imparts the pattern to the workpiece, adjusting a data set of the spatial light modulator can compensate for the positioning error.

Adjusting the data set of a spatial light modulator can further compensate for a distortion of the workpiece, as indicated in the positioning error. As an example, a distortion mapping is based on an indicated distortion in the determined positioning error. The distortion mapping is applied to modify the data for the spatial light modulator, so that a pattern imparted to the workpiece by the spatial light modulator using the distortion mapped data compensates for the distortion of the workpiece.

With reference to FIGS. 17 and 18, the acts of capturing first and second images of a workpiece are shown in isolation of the various transport mechanisms and as related to a time interval. The time interval is the passage of time between a first occasion 1708, depicted as a setting on a clock in FIG. 17, and a second occasion 1808, depicting as a further setting on a clock in FIG. 18.

In FIG. 17, an imaging unit 1706 is capturing a first image of a region 1704 of a workpiece 1702, on a first occasion 1708. The workpiece 1702 is at the first location.

After the first image is captured, a time interval or period of time elapses. During the time interval between the first occasion 1708 and the second occasion 1808, the workpiece 1702 may remain at the first location, may be moved as depicted by an arrow 1710 to a second, third or fourth location, or may be moved from the first location as depicted by an arrow 1712 to a storage location or for further processing and then returned to the first location as depicted by an arrow 1714. These various examples of a workpiece 1702 remaining at a first location, returning to a first location or moving to a further location are applicable to various systems and transport mechanisms, and illustrate the flexibility of the alignment system 100, methods 1500, 1600 and variations. The time interval or period of time between the capturing of the first and second images may be short or long as specific to a defined system or situation. Whether or not additional processing occurs and whether or not a change in positioning or a distortion occurs in the workpiece during the time interval are also specific to a defined system or situation.

In FIG. 18, a second image of the region 1704 of the workpiece 1702 is being captured, on a second occasion 1808 that is later than the first occasion 1708. The second image is captured, in variations, by the imaging unit 1706, by a further imaging unit 1810 or by an imaging system having one or more imaging units. Any of the imaging units 1706, 1810 or the tool 1812 can be stationary or movable in various systems. The second image is captured, in variations, with the workpiece being at the first location or with the workpiece being at the second location, in systems having manual transporting of the workpiece or a transport mechanism for the workpiece.

With reference to FIG. 19, a spatial light modulator 1902 can compensate for a positioning error or a distortion of a workpiece 1904, in a photolithography system using the alignment system 100 or variation thereof. The spatial light modulator 1902, which can be part of the projection optics in a photolithographic apparatus, is projecting an image 1906 on a workpiece 1904. Pattern data 1908 is modified by a controller 1914 applying positioning information 1910. The positioning information 1910 can include positioning error and/or distortion mapping. The modified pattern data 1912 from the controller 1914 is sent to the spatial light modulator 1902, such that the projected image 1906 corrects for the positioning error and/or the distortion of the workpiece 1904, according to the positioning information 1910 provided to the controller 1914. In a further example, for systems using continuous material flow, the positioning information 1910 can include timing information so that the projected image from the spatial light modulator 1902 can be timed or the pattern data can be adjusted or modified to match the timing of a moving workpiece.

As has been shown, the alignment system 100, methods 1500, 1600 and variations thereof are usable with various workpieces or with continuous or discontinuous material flows and are applicable in aligning a tool to a workpiece having few preprocessing steps or materials applied as well as to workpieces having multiple preprocessing steps or materials applied. The alignment system, methods and variations are applicable to a workpiece that does not have a previously deposited alignment reticle pattern from an alignment mask or can be used in conjunction with alignment reticle patterns.

What is claimed is:

1. A method of alignment comprising:
    selecting at least one of a plurality of microscopic native features of a surface region of a workpiece, the features being detected by an imaging system at a first occasion with the workpiece being at a first location;
    tracking, with a controller, the at least one of the plurality of microscopic native features as detected by the imaging system at a second occasion, a period of time elapsing between the first and second occasions; and controlling an alignment of a tool to the workpiece, based on the tracking of the at least one of the plurality of microscopic native features.

2. The method of claim 1 wherein tracking includes pattern matching.

3. The method of claim 1, wherein tracking includes determining positioning information of the at least one of the plurality of microscopic native features.

4. The method of claim 3, wherein the positioning information includes a positioning error of the at least one of the plurality of microscopic native features relative to the second occasion.

5. The method of claim 1 wherein controlling the alignment of the tool to the workpiece compensates for a difference between an expected positioning of the workpiece at the second occasion and a determined positioning of the workpiece at the second occasion.

6. The method of claim 1 further comprising determining a distortion of the workpiece, based on the tracking of the at least one of the plurality of microscopic native features.

7. The method of claim 6 wherein controlling the alignment of the tool to the workpiece compensates for the distortion of the workpiece.

8. The method of claim 1, wherein the workpiece is at a first location at the second occasion.

9. The method of claim 1, wherein the workpiece is at a second location at the second occasion.

10. The method of claim 9, further comprising moving the workpiece continuously from the first location to and past the second location to a third location.

11. The method of claim 10 wherein controlling the alignment of the tool to the workpiece is applied in imparting a pattern to a portion of the workpiece with the portion of the workpiece being at one of the second location, the third location or a fourth location between the first and second locations.

12. The method of claim 10 further comprising projecting an exposure image onto a portion of the workpiece with the portion of the workpiece being at one of the second location, the third location or a fourth location between the first and second locations, the exposure image being aligned with the portion of the workpiece as a result of the controlling of the alignment of the tool to the workpiece.

13. The method of claim 1 wherein the alignment of the tool to the workpiece is controlled in a lithographic apparatus.

14. The method of claim 1 wherein the workpiece is a portion of a continuous web of material.

15. A method of aligning a tool, the method comprising:
capturing a first magnified image of a plurality of microscopic native features in a first region of a workpiece using an imaging system, the workpiece being at a first location for the first image;
capturing a second magnified image of the plurality of microscopic native features in the first region of the workpiece using the imaging system, a time interval passing between capturing the first magnified image and capturing the second magnified image;
determining a correspondence between the plurality of microscopic native features of the workpiece as captured in the first image and the plurality of microscopic native features of the workpiece as captured in the second image;
determining a positioning information of the workpiece relative to the second image, using a controller to analyze the microscopic native features having the correspondence between the first and second images; and
aligning the workpiece and the tool, based upon the positioning information determined relative to the second image.

16. The method of claim 15, wherein the positioning information includes a positioning error of the workpiece relative to the second image.

17. The method of claim 15, wherein the second image has a lesser magnification than the first image.

18. The method of claim 15, wherein the second image has a greater magnification than the first image.

19. The method of claim 15 wherein the imaging system includes a first imaging unit capturing the first image and a second imaging unit capturing the second image.

20. The method of claim 15 further comprising capturing a first plurality of magnified images of the workpiece, including the first image, on a first occasion and capturing a second plurality of magnified images of the workpiece, including the second image, on a second occasion.

21. The method of claim 15 wherein the positioning information includes at least one of a displacement error, a rotation error and a scale change.

22. The method of claim 15 wherein the positioning information of the workpiece includes at least a first positioning error of a first one of the plurality of microscopic native features of the workpiece and a second positioning error of a second one of the plurality of microscopic native features of the workpiece.

23. The method of claim 15 wherein at least one of determining the correspondence and determining the positioning information includes applying a pattern matching to the first and second images.

24. The method of claim 15, wherein the workpiece is at the first location for the second image.

25. The method of claim 15, wherein the workpiece is at a second location for the second image.

26. The method of claim 25, further comprising moving the workpiece from the first location to the second location using a transport mechanism.

27. The method of claim 25, further comprising moving the workpiece continuously from the first location through the second location to at least a third location, using a transport mechanism having a continuous material flow.

28. The method of claim 15, wherein the tool is a lithographic apparatus and aligning the workpiece and the tool includes aligning the workpiece and a pattern to be imparted to the workpiece by the lithographic apparatus.

29. The method of claim 28 wherein:
The workpiece is at a second location for the second image; and
the workpiece is at the second location as the pattern is imparted to the workpiece.

30. The method of claim 28 wherein at least a portion of the workpiece is at a third location as the pattern is imparted to the workpiece, the workpiece and the pattern being aligned based upon an extrapolation of the positioning information as determined with at least a portion of the workpiece being at a second location for the second image.

31. The method of claim 28 wherein:
the workpiece includes the first region and a second region;
the positioning information is determined relative to the first region of the workpiece with the first region being at a second location for the second image; and
the pattern is imparted to the second region of the workpiece, the second region of the workpiece being at a fourth location intermediate between the first location and the second location, based upon an interpolation of the positioning information.

32. The method of claim 31 wherein:
the workpiece includes a first article having the first region and a second article having the second region;
the positioning information is determined relative to the first region of the first article; and
the pattern is imparted to the second region of the second article.

33. The method of claim 28 wherein aligning the workpiece and the pattern to be imparted to the workpiece includes adjusting a lateral positioning of the workpiece.

34. The method of claim 28 wherein:
the lithographic apparatus is a photolithographic apparatus having a projection optics unit that imparts the pattern to the workpiece; and
aligning the workpiece and the pattern includes adjusting a timing of an exposure using the projection optics unit, to compensate for a positioning error indicated by the positioning information.

35. The method of claim 28 wherein:
the lithographic apparatus is a photolithographic apparatus having a projection optics unit; and
aligning the workpiece and the pattern to be imparted to the workpiece includes adjusting an aiming of the projection optics unit.

36. The method of claim 28 wherein:
the lithographic apparatus is a photolithographic apparatus having a spatial light modulator that imparts the pattern to the workpiece; and
aligning the workpiece and the pattern includes adjusting a data set of the spatial light modulator in the photolithographic apparatus to compensate for a positioning error indicated by the positioning information.

37. The method of claim 36 wherein:
the positioning information indicates a distortion of the workpiece; and
adjusting the data set compensates for the distortion of the workpiece.

38. An alignment system comprising:
an imaging system arranged to capture a first image of a region of a workpiece with the workpiece being at a first location and to later capture a second image of the region of the workpiece; and
a pattern recognition unit configured to compare an inherent microscopically visible texture of the workpiece in the first and second images and to generate positioning information therefrom;
wherein the alignment system employs the positioning information in aligning a tool to the workpiece.

39. The alignment system of claim 38, wherein the workpiece is at the first location for the second image.

40. The alignment system of claim 39, wherein the workpiece is removed from the first location after the first image is captured and is replaced at the first location before the second image is captured.

41. The alignment system of claim 39, wherein the workpiece receives an additional processing after the first image is captured and before the second image is captured.

42. The alignment system of claim 38, wherein the workpiece is at a second location for the second image.

43. The alignment system of claim 38 further including a transport mechanism.

44. The alignment system of claim 43 wherein the transport mechanism includes a robotic handler.

45. The alignment system of claim 43 wherein the workpiece is moved continuously from the first location through at least the second location by the transport mechanism.

46. The alignment system of claim 43, wherein:
the workpiece is a portion of a web of material; and
the web of material is moved by the transport mechanism.

47. The alignment system of claim 38 wherein the imaging system includes a first imaging unit to capture the first image and a second imaging unit to capture the second image.

48. The alignment system of claim 38 wherein the imaging system includes a first strobe camera aimed at the first location to capture the first image and a second strobe camera aimed at a second location to capture the second image.

49. The alignment system of claim 38 wherein the imaging system includes at least two imaging units arranged to capture images of the workpiece with the workpiece being at the first location.

50. The alignment system of claim 38 wherein the imaging system includes at least two imaging units arranged to capture images of the workpiece with the workpiece being at a second location.

51. The alignment system of claim 38 wherein the tool is a photolithography apparatus and a pattern is projected onto the workpiece from a mask or a spatial light modulator.

52. An alignment system for lithography, comprising:
a first high resolution imaging unit configured to capture a first image of a region of a workpiece with the workpiece being at a first location;
a second high resolution imaging unit configured to capture a second image of the region of the workpiece after the first image is captured;
a controller communicating with the first and second high resolution imaging units and connectable to a lithography apparatus; and
the controller being configured to direct an alignment of the lithography apparatus and the workpiece in response to determining a positioning error of the workpiece relative to the second image by analyzing an inherent microscopically visible texture of the workpiece in the first and second images.

53. The alignment system of claim 52 wherein the second image is captured with the workpiece being at the first location, the workpiece being removed from the first location after the first image is captured and being replaced at the first location before the second image is captured.

54. The alignment system of claim 52 wherein the second image is captured with the workpiece being at the first location, the workpiece having received an additional processing after the first image is captured and before the second image is captured.

55. The alignment system of claim 52 wherein the second image is captured with the workpiece being at a second location.

56. The alignment system of claim 55 wherein the workpiece is being moved continuously from the first location through at least the second location.

57. The alignment system of claim 52 wherein the controller is further configured to direct the lithography apparatus to correct for a distortion of the workpiece as indicated by the positioning error.

58. A photolithography system comprising:
a transport mechanism configured to move a web of material so that a region on the web of material travels from a first location through a second location to a third location;
a machine vision system configured to microscopically image the region at the first location and at the second location; and
projection optics configured to place a projected image on the web of material at the second location, the third location or a fourth location intermediate between the first location and the second location;

wherein the projection optics, the transport mechanism and the machine vision system cooperate to align the projected image and the region by analyzing relative displacement of correlated features belonging to an inherent microscopically visible texture of the region as imaged at the first location and at the second location.

59. The photolithography system of claim 58 wherein the region on the web stops at the second location en route to the third location.

60. The photolithography system of claim 58 wherein the region on the web stops at the fourth location en route to the second location.

61. The photolithography system of claim 58 wherein the region on the web of material travels continuously from the first location through the second location to the third location.

62. The photolithography system of claim 58 wherein the projection optics, the transport mechanism and the machine vision system further cooperate to correct the projected image for a distortion of the web of material as determined from analyzing the relative displacement of the correlated features.

63. The photolithography system of claim 62 wherein:
the projection optics includes a spatial light modulator; and
correcting the projected image for a distortion of the web of material includes applying a distortion mapping to a pattern data for the spatial light modulator.

\* \* \* \* \*